(12) United States Patent
Gao et al.

(10) Patent No.: US 7,257,902 B2
(45) Date of Patent: Aug. 21, 2007

(54) STAGE DEVICE

(75) Inventors: Wei Gao, Sendai (JP); Satoshi Kiyono, Sendai (JP); Yoshiyuki Tomita, Yokosuka (JP); Makoto Tano, Sendai (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 11/522,400

(22) Filed: Sep. 18, 2006

(65) Prior Publication Data

US 2007/0035267 A1   Feb. 15, 2007

Related U.S. Application Data

(63) Continuation of application No. PCT/JP2005/004757, filed on Mar. 17, 2005.

(30) Foreign Application Priority Data

Mar. 19, 2004   (JP) ............................. 2004-080603

(51) Int. Cl.
   *G01D 21/00*   (2006.01)
(52) U.S. Cl. .......................... 33/1 M; 33/503; 33/568; 33/573

(58) Field of Classification Search ................. 33/568, 33/573, 503, 613, DIG. 2, 1 M
See application file for complete search history.

(56) References Cited

U.S. PATENT DOCUMENTS

| 6,817,104 B2 * | 11/2004 | Kaneko et al. | 33/1 M |
| 2003/0213135 A1 * | 11/2003 | Kaneko et al. | 33/1 M |
| 2005/0198844 A1 * | 9/2005 | Lee et al. | 33/1 M |
| 2006/0064884 A1 * | 3/2006 | Seo | 33/1 M |

FOREIGN PATENT DOCUMENTS

| JP | 05-328702 | 12/1993 |
| JP | 8-313303 | 11/1996 |
| JP | 10-38549 | 2/1998 |

* cited by examiner

*Primary Examiner*—Yaritza Guadalupe-McCall
(74) *Attorney, Agent, or Firm*—Squire, Sanders & Dempsey L.L.P.

(57) ABSTRACT

This invention relates to a stage device which is moved with high accuracy in an X-Y direction and a rotating direction using a planar motor. The invention is aimed at reducing the size of the stage device and at performing accurately measurement of a position of the stage to the base. The stage device comprises a scale unit having a scale part on the entire plane of the base, and three two-dimensional angle sensors disposed on a bottom surface of a movable stage part. The scale unit and the two-dimensional angle sensors form a surface encode. A position of the movable stage part is measured by the surface encoder.

6 Claims, 10 Drawing Sheets

STAGE DEVICE

CROSS-REFERENCE TO RELATED APPLICATION

This application is a U.S. continuation application which is filed under 35 USC 111(a) and claims the benefit under 35 USC 120 and 365(c) of International Application No. PCT/JP2005/004757, filed on Mar. 17, 2005, the entire contents of which are hereby incorporated by reference.

BACKGROUND OF THE INVENTION

1. Field of the Invention

The present invention generally relates to a stage device, and more particularly to a stage device which is moved with high accuracy in a X-Y direction and a rotating direction by using a planar motor.

2. Description of the Related Art

Concerning ultra-precision machining devices and semiconductor devices which are the basis of information processing technology, the demand for high-accuracy positioning and high-speed processing of stage devices, used for these devices, is increasing. For example, for the stage device which is a key component of a semiconductor exposure device, the positioning accuracy on the order of 10 nm and the movement range of several hundreds of millimeter are needed. And, in order to aim at improvement in the productivity of semiconductor devices, it is necessary to move the stage on which a work piece is mounted to the processing position at a high speed. For this reason, it is desirable to implement the stage device which solves all of the above-mentioned problems.

For example, in various semiconductor manufacturing devices used in semiconductor manufacturing processes, the stage device is provided so that the wafer used as a movable body is carried on the stage device and the wafer carried on the stage device is moved therein. The stage device includes a drive unit which drives the movement of the stage on which the wafer is carried to the base, and a position measuring device which measures the position of the stage to the base.

A stack type stage device is known as a conventional drive unit, in which the stage which is moved in the X direction only and the stage which is moved in the Y direction only are accumulated. Since it is necessary for the stack type stage device to have a high-horizontal rigidity, and there is a problem that the weight of the device itself becomes heavy and a large error of the position in the perpendicular direction may occur due to the influence of the weight.

A SAWYER motor is known as a drive unit which is devised in order to solve the above problem. The SAWYER motor is one of planar motors, and can move freely the stage in the X-Y direction and in the rotating direction.

The planar motor in the present specification is meant such that the structural part of the motor is provided in the stage, and, in association with the convex part provided in the base, the planar motor is able to lift the stage over the base and able to move the stage to a desired position directly, without using the X-direction and Y-direction shafts. For example, refer to Japanese Laid-Open Patent Application No. 05-328702.

Figure 1:
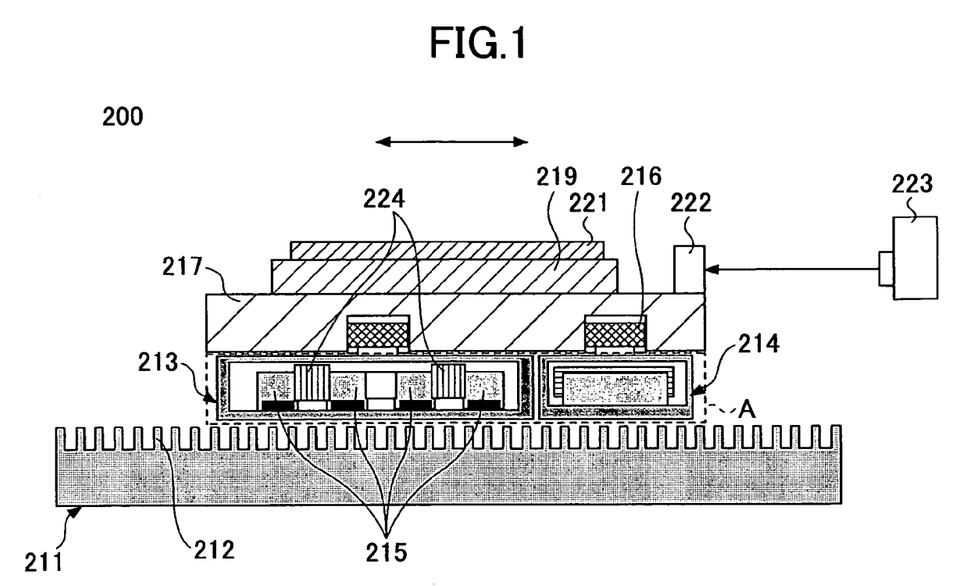
FIG. 1 is a schematic diagram of a stage device which uses a SAWYER motor.
Figure 2:
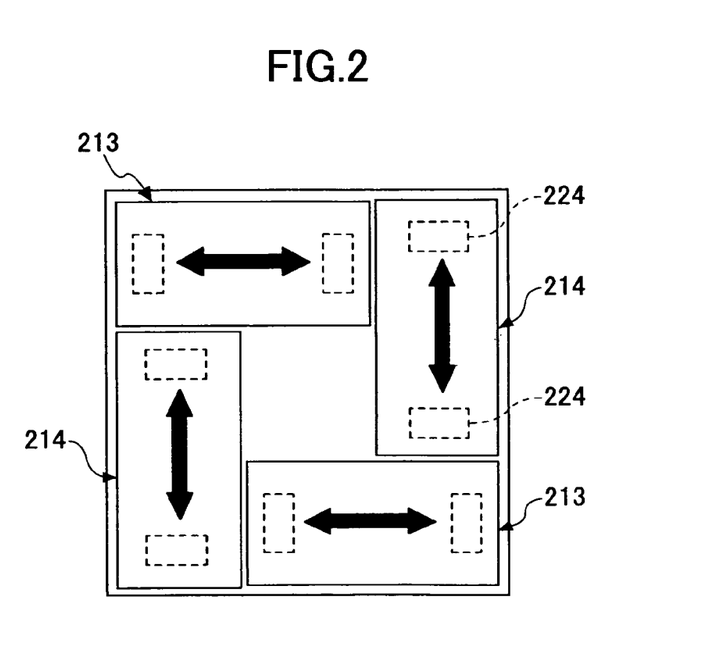
FIG. 2 is a plan view of the structure of the stage device corresponding to the area A indicated in FIG. 1.

Next, the stage device which uses the SAWYER motor will be explained with reference to FIG. 1 and FIG. 2. FIG. 1 is a schematic diagram of the stage device which uses the SAWYER motor, and FIG. 2 is a plan view of the structure of the stage device corresponding to the area A indicated in FIG. 1.

The stage device 200 generally includes a base 211, a pair of X-direction actuators 213, a pair of Y-direction actuators 214, a tilt actuator 216, a movable stage part 217, a fixed stage part 219, a chuck 221, a mirror 222, and a laser measuring instrument 223. The planar motor is constituted by the pair of X-direction actuators 213, and the pair of Y-direction actuators 214.

A plurality of convex parts 212 are provided on the top surface of the base 211 at intervals of a predetermined distance. The X-direction actuator 213 is constituted by a plurality of coil parts 215 and a plurality of air bearings 224.

By applying the current to the coil parts 215, the driving force is generated to move the movable stage part 217. The Y-direction actuators 214 are constituted by the plurality of coil parts 215 and the pair of air bearings 224. By applying the current to the coil parts 215, the driving force is generated in the X-direction actuator 213 and the Y-direction actuator 214, and the movable stage part 217 is moved.

The tilt actuator 216 is provided for adjusting the horizontal attitude of the movable stage part 217. The fixed stage part 219 is arranged integrally with the movable stage part 217. On the fixed stage part 219, the chuck 221 for mounting the work piece (the movable body) is arranged integrally with the fixed stage part 219.

The mirror 222 is arranged on the movable stage part 217. This mirror 222 is provided for reflecting the laser beam which is emitted by the light source. The laser beam is reflected to a laser measuring instrument 223 by the mirror 222, so that the position of the movable stage part 217 is measured by the laser measuring instrument 223.

In this position measuring device that determines the position in the X-Y direction using the laser interference displacement gauge 223, two displacement gauges are combined with a highly precise straightedge which covers the movement range perpendicular to the displacement measuring direction and has the guaranteed shape accuracy, and thereby performing the position detection.

Among other conventional position measuring devices, there are known position measuring devices which have the structure in which a given number of measuring devices, such as rotary encoders and linear encoders, are arranged for a given number of degrees of freedom. For example, when performing two-dimensional positioning, one of the position measuring devices having such structure may be configured so that the stage which is moved in the X-direction and the stage which is moved in the Y-direction are accumulated independently of each other. Another of the position measuring device having such structure may be configured so that the peripheral scale and the one-axial stage are combined, and a rotational position and a radial position are measured independently, and positioning is performed.

Conventionally, when detecting the position equivalent to pitching and yawing angles of a moving body, the autocollimator has been used. This autocollimator is adapted to measure the pitching and yawing angles of the moving body simultaneously with respect to movement in the straight line direction along one axis, but it requires the highly precise straightedge to measure the position of the moving body in the X-Y direction thereof.

Moreover, the level vial is known as the device which measures the rolling angle of a moving body. However, the level vial has a problem in the response speed and measurement accuracy, and it is unsuitable for a high accuracy measuring device.

To obviate the problem, the method in which two parallel straightedges are arranged to compute a rolling angle from a difference between the distances to the straightedges has been used. Moreover, the method in which a single straightedge is arranged as a reference mirror surface to detect a rolling angle using an autocollimator has been used. See Japanese Laid-Open Patent Application No. 05-328702.

However, the following problems arise in the stage device using the above-mentioned conventional position measuring device. That is, the measuring device used in the conventional position measuring device, such as a rotary encoder or a linear encoder, can perform only one-dimensional positioning. In order to perform two-dimensional positioning, it is necessary to combine at least two sets of the above-mentioned measuring devices. And the design of a moving body position measuring device has a considerable constraint in the structure thereof.

Also in the case in which positioning is performed using the laser measuring instrument 223, what can be performed is only one-dimensional positioning. In order to perform two-dimensional positioning, it is necessary to use the straightedge which is constructed with high accuracy. Consequently, when the position measuring device of this kind is provided in the stage device, there is a constraint in the structure thereof, and the manufacturing cost becomes high.

SUMMARY OF THE INVENTION

According to one aspect of the invention, there is provided an improved stage device in which the above-mentioned problems are eliminated. According to one aspect of the invention, there is provided a stage device which can attain the miniaturization of the stage device and can perform the measurement of a position of the stage to the base with high accuracy.

In an embodiment of the invention which solves or reduces one or more of the above-mentioned problems, there is provided a stage device which comprises: a base; a stage carrying a movable body and being moved over the base; a planar motor driving the stage; an air bearing acting to lift the stage over the base; a scale part disposed on the base to include an angle grating which has an angle-related characteristic varied in a two-dimensional direction in accordance with a known function; and at least one two-dimensional angle sensor disposed on the stage so that the at least one two-dimensional angle sensor emits a light beam to the angle grating of the scale part and detects a two-dimensional angle of a light beam reflected from the scale part.

The present invention can provide a stage device which attains the miniaturization of the stage device and performs measurement of a position of the stage to the base with high accuracy.

According to the stage device of the present invention, the scale part is provided on the base and the two-dimensional angle sensors are provided on the stage, and it is possible that two or more stages be carried on the base and the two or more stages be individually moved in the condition in which the position detection is possible.

Since there is no guide structure of the shaft and the planar motor which can control the X-direction movement, the Y-direction movement and the rotational movement around the Z axis is used, it is possible that the weight of the stage device be saved and the manufacturing cost be reduced.

Since the scale part is formed from the two-dimensional angle grating indicating an angle configuration, it is possible to detect a pitching angle, a rolling angle, a yawing angle, and a two-dimensional position of the stage by using the angle sensors combined with a single scale.

And, by using the angle grating, the position detection of a two-dimensional coordinate position, which is represented by any of rectangular coordinates, cylindrical coordinates, polar coordinates, and free-form surface coordinates, can be attained.

Since the two-dimensional angle sensors have a dead pass which is very small when compared with the conventional laser interferometer, they are unlikely to be influenced by the instrumentation error due to thermal expansion, fluctuation of air, etc. Therefore, it is possible to perform high-accuracy position and attitude measurement.

DETAILED DESCRIPTION OF PREFERRED EMBODIMENTS

A description will be given of embodiments of the invention with reference to the accompanying drawings.

First, with reference to FIG. 3 and FIG. 4, the stage device 230 in the first embodiment of the invention will be explained.

Figure 3:
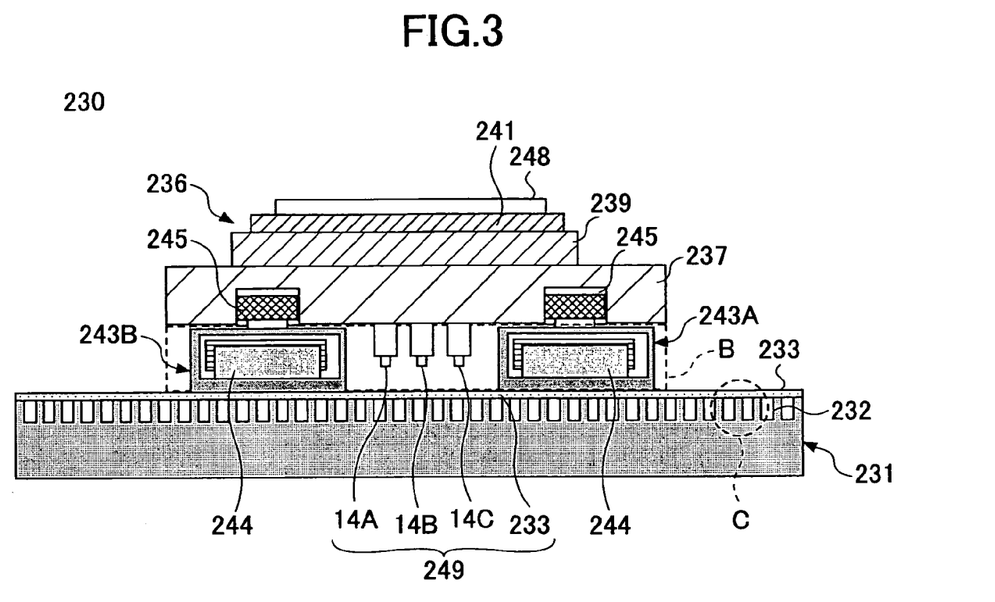
FIG. 3 is a cross-sectional diagram of a stage device in a first embodiment of the invention.
Figure 4:
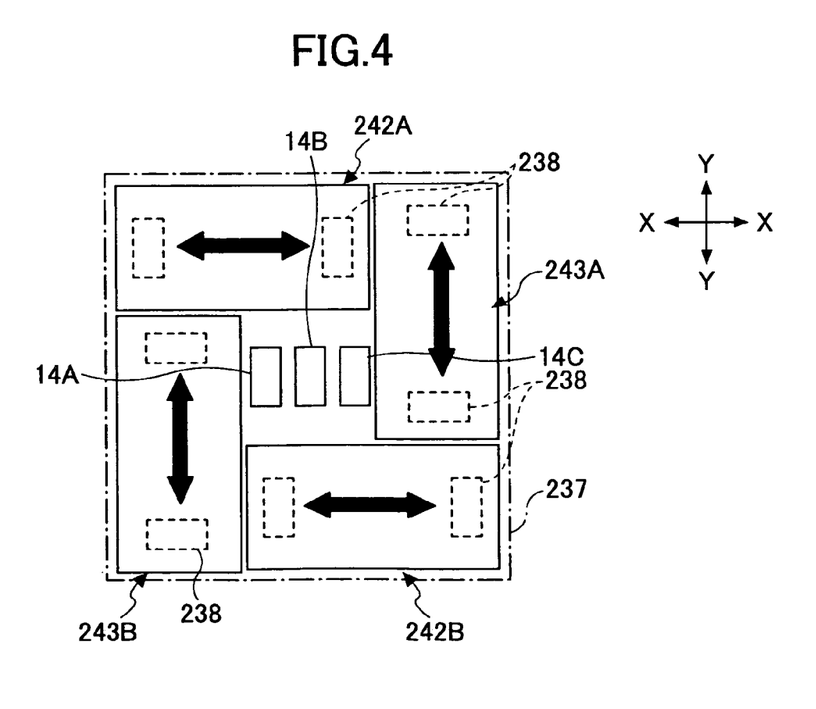
FIG. 4 is a plan view of the structure of the stage device corresponding to the area B indicated in FIG. 3.

FIG. 3 is a cross-sectional diagram of the stage device of the first embodiment, and FIG. 4 is a plan view of the structure of the stage device corresponding to the area B indicated in FIG. 3.

The stage device 230 is a stage device having a SAWYER motor drive part. The stage device 230 comprises a base 231, a stage 236, and a surface encoder 249 as shown in FIG. 3. A plurality of convex parts 232 are formed on the surface of the base 231 at a predetermined pitch. This predetermined pitch is equivalent to the minimum unit of length by which a movable stage part 237 can be moved. The base 231 is made of a metal, such as iron. The stage 236 comprises a movable stage part 237, a fixed stage part 239, a chuck 241, X-direction actuators 242A and 242B, Y-direction actuators 243A and 243B, and tilt actuators 245.

The movable stage part 237 is a base part which is driven by the X-direction actuators 242A and 242B and the Y-direction actuators 243A and 243B.

As shown in FIG. 4, under the movable stage, part 237, the X-direction actuators 242A and 242B and the Y-direction actuators 243A and 243B are disposed, and a certain space is provided in the center portion.

Each of the X-direction actuators 242A and 242B and the Y-direction actuators 243A and 243B comprises two or more coil parts 244 and two or more air bearings 238, respectively. By supplying the current to the coil part 244, a magnetic force is generated in the coil part 244, so that the actuating force is exerted to actuate the movable stage part 237.

The air bearings 238 are provided for lifting the X-direction actuators 242A and 242B and the Y-direction actuators 243A and 243B relative to the base 231 according to the force of air. By providing the air bearings 238, when the movable stage part 237 is actuated in the direction of X, the direction of Y, or the direction of θ, the movement can be performed freely in any direction.

The tilt actuator 245 is provided respectively between the movable stage part 237 and each of the X-direction actuators 242A and 242B and the Y-direction actuators 243A and 243B. These tilt actuators 245 are provided for performing horizontal positioning of the movable stage part 237.

The fixed stage part 239 is arranged integrally on the movable stage part 237. The fixed stage part 239 is moved to a desired position by driving the movable stage part 237 using the X-direction actuators 242A and 242B and the Y-direction actuators 243A and 243B. On the fixed stage part 239, the chuck 241 is disposed for mounting a work piece 248 (movable body).

Next, a description will be given of the method of driving the movable stage part 237 with reference to FIG. 5A to FIG. 5D.

FIGS. 5A-5D are diagrams for explaining the relationship between the driving direction of the movable stage and the actuating force of the X-direction and the Y-direction actuators.

Figure 5A:
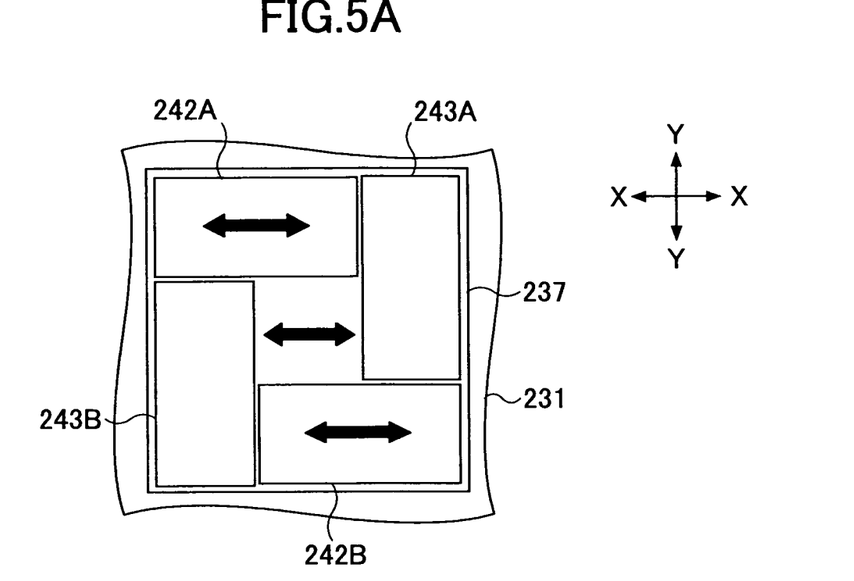
FIG. 5A is a diagram for explaining the relationship between the driving direction of the movable stage and the actuating force of the X-direction and Y-direction actuators.

When moving the movable stage part 237 in the X-X direction, as shown in FIG. 5A, the current is supplied to the coil parts 244 provided in the X-direction actuators 242A and 242B, so that the actuating force of the X-direction actuators 242A and 242B is generated in the X-X direction in which the movable stage part 237 is moved to a desired position.

Figure 5B:
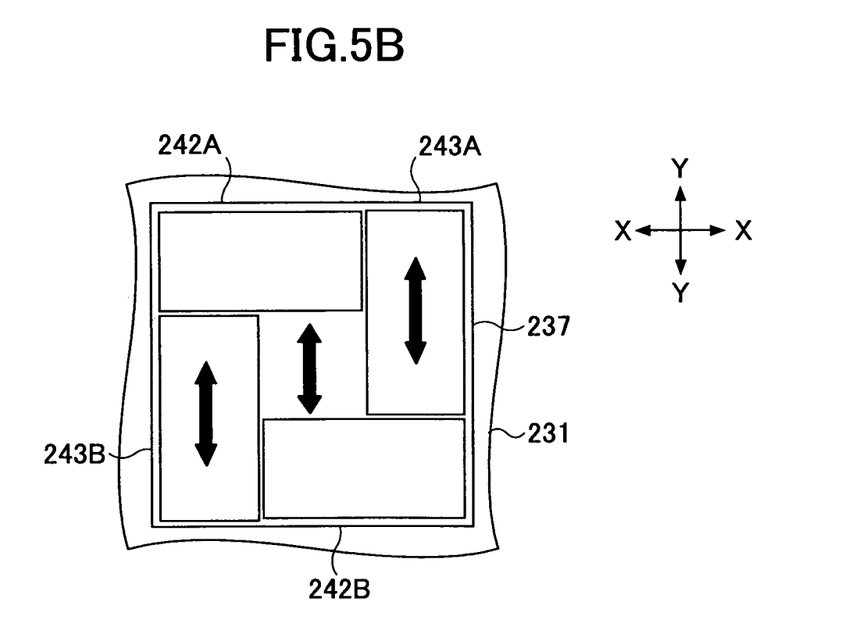
FIG. 5B is a diagram for explaining the relationship between the driving direction of the movable stage and the actuating force of the X-direction and Y-direction actuators.

When moving the movable stage part 237 in the Y-direction, as shown in FIG. 5B, the current is supplied to the coil parts 244 provided in the Y-direction actuators 243A and 243B, so that the actuating force of the Y-direction actuators 243A and 243B is generated in the Y-direction in which the movable stage part 237 is moved to a desired position.

Figure 5C:
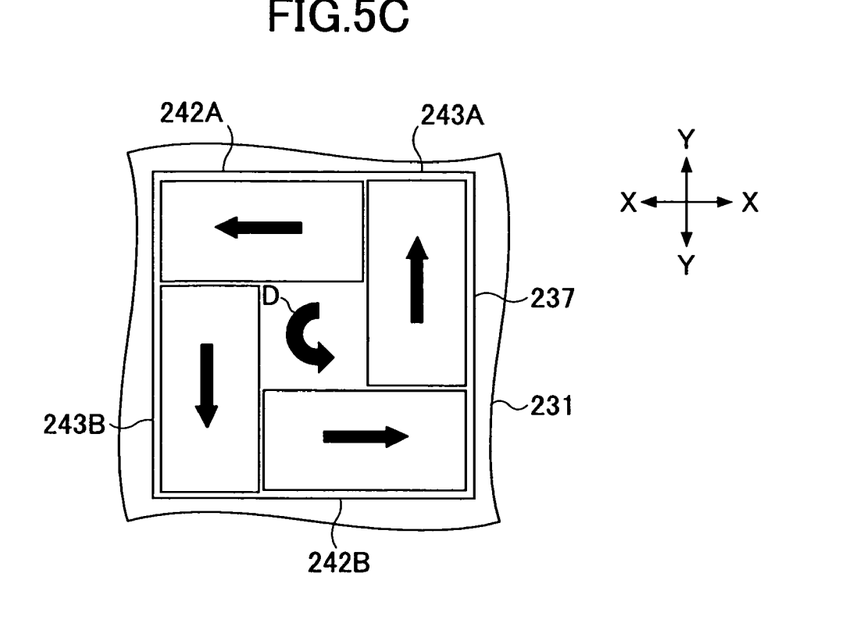
FIG. 5C is a diagram for explaining the relationship between the driving direction of the movable stage and the actuating force of the X-direction and Y-direction actuators.
Figure 5D:
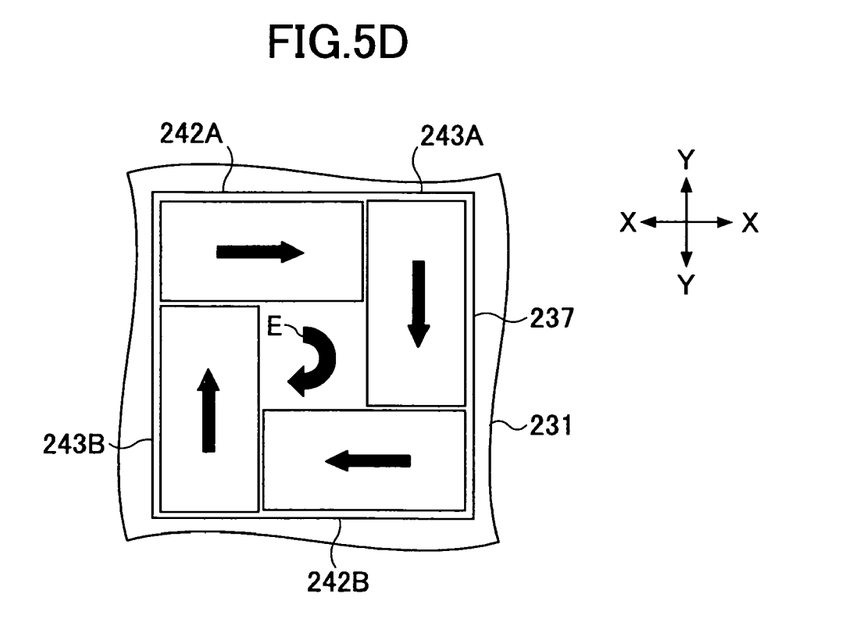
FIG. 5D is a diagram for explaining the relationship between the driving direction of the movable stage and the actuating force of the X-direction and Y-direction actuators.

When moving the movable stage part 237 in the direction of θ, as shown in FIG. 5C or FIG. 5D, the current is supplied to the coil parts 244 provided in the X-direction actuators 242A and 242B and the Y-direction actuators 243A and 243B, so that the actuating force of the X-direction actuators 242A and 242B and the Y-direction actuators 243A and 243B is generated in the direction indicated by the arrow D or the arrow E.

And when the fixed stage part 239 is moved to the desired position on the base 231, the supply of the current to the coil part 244s is stopped and the position of the fixed stage part 239 is fixed. As described previously, the pitch of the convex parts 232 provided in the surface of the base 231 is equivalent to the minimum unit of length by which the movable stage 237 can be moved.

Next, the surface encoder 249 will be explained with reference to FIG. 3 and FIG. 4. The surface encoder 249 is providing for performing position measurement of the movable stage 237. The surface encoder 249 comprises a scale unit 233 and two-dimensional angle sensors 14A-14C.

Figure 6:
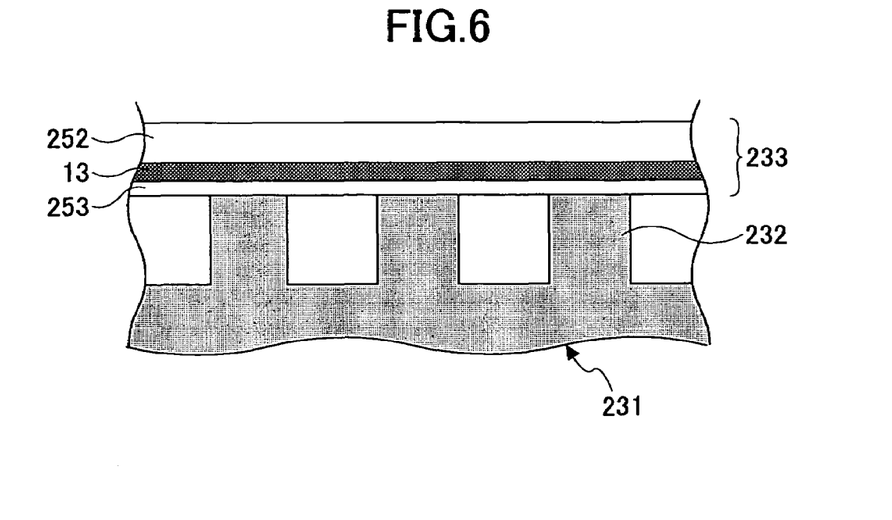
FIG. 6 is an enlarged view of the part of the stage device corresponding to the area C indicated in FIG. 3.

Next, the scale unit 233 will be explained with reference to FIG. 6. FIG. 6 is an enlarged view of the part of the stage device corresponding to the area C indicated in FIG. 3. The scale unit 233 is disposed on the convex parts 232 provided in the base 231. The scale unit 233 comprises a scale part 13, an upper resin 252, and a lower resin 253.

Figure 7:
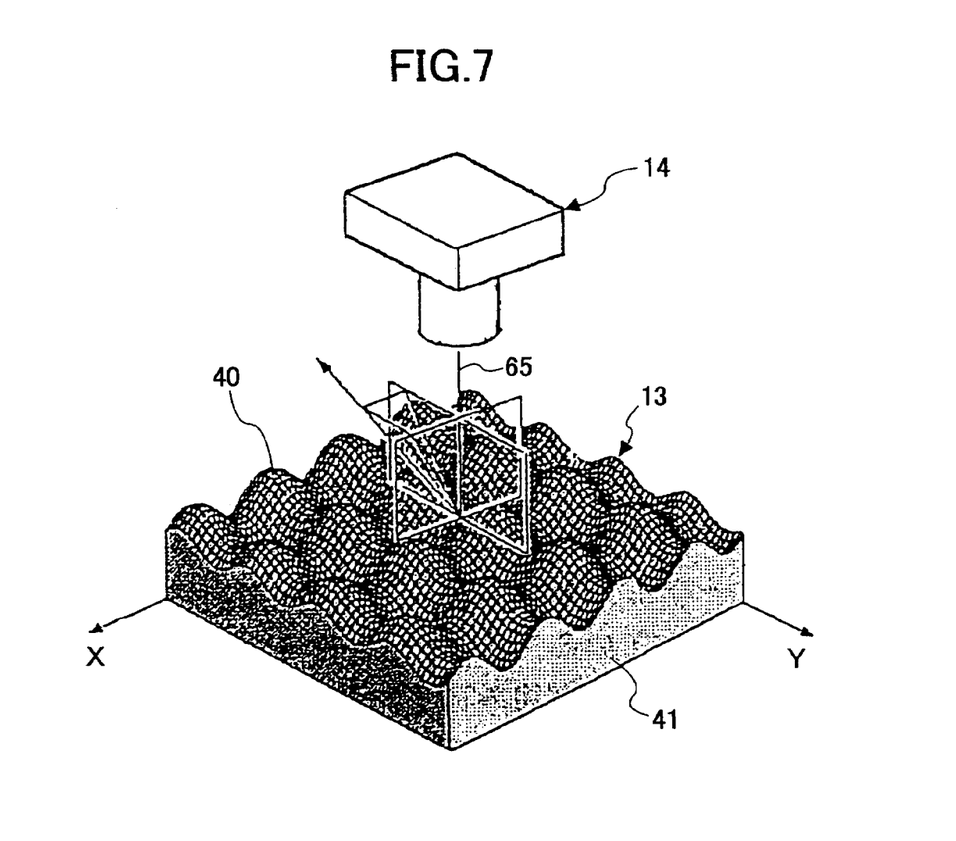
FIG. 7 is a perspective view of a scale part and a two-dimensional angle sensor.

As shown in FIG. 7, the scale part 13 is provided with a number of angle gratings 40 in which the angle-related characteristic changes in the two dimensions in the directions of X and Y in accordance with a known function (which is, in this embodiment, the set of crests and troughs of a sinusoidal wave).

The upper resin 252 is provided on the top surface of the scale part 13, and the lower resin 253 is provided on the bottom surface of the scale part 13. The upper and lower resins 252 and 253 are provided for protecting the scale part 13 from being damaged by an external force. The upper resin 252 is made of a transparent material that has a good transmission coefficient for a light beam to pass through.

As shown in FIG. 3 and FIG. 4, the two-dimensional angle sensors 14A-14C are disposed on the bottom part of the movable stage part 237 which is surrounded by the X-direction actuators 242A and 242B and the Y-direction actuators 243A and 243B. In this embodiment, the stage device is provided with the three two-dimensional angle sensors 14A-14C.

Thus, the two-dimensional angle sensors 14A-14C in this embodiment are provided on the bottom part of the movable stage part 237 which is located adjacent to the scale part 13, and they are hardly influenced by the effect of disturbance, such as fluctuation of air, as in the conventional laser interferometer. And it is possible for the two-dimensional angle sensors 14A-14C to detect the exact position of the fixed stage 239.

The combination of at least three two-dimensional angle sensors 14A-14C and the scale part including the two-dimensional angle gratings 40 allows the detection of the two-dimensional coordinate position, the pitching angle, the rolling angle, and the yawing angle of the moving body by the relative movement between the scale part and the angle sensors. And the distance between the scale part and the angle sensors can also be detected by giving a predetermined angle change to the angle sensors.

The three two-dimensional angle sensors 14A-14C are provided in this embodiment. However, in order to facilitate the following description, the structure in which only one two-dimensional angle sensor 14 is provided is assumed.

The height configuration f (x, y) of the angle gratings 40 provided in the scale part 13 is represented by the following formula:

$$f(x, y) = A_x \cdot \sin(2\pi x/\lambda_x) + A_y \cdot \sin(2\pi y/\lambda_y) \quad (1)$$

In the above formula, Ax and Ay denote the amplitude in the X-direction and the amplitude in the Y-direction, respectively, and λx and λy denote the wavelength in the X-direction and the wavelength in the Y-direction, respectively.

And the X-direction and Y-direction angle configurations θ (x) and ψ (y) of the angle gratings 40 (which are the outputs of the two-dimensional angle sensors 14 when the measurement is performed) are derived from the partial differentials of the configuration of the angle gratings 40, respectively, and they are represented by the following formulas:

$$\theta(x) = \delta f/\delta x = (2\pi A_x/\lambda_x) \cdot \cos(2\pi x/\lambda_x) \quad (2)$$

$$\psi(y) = \delta f/\delta y = (2\pi A_y/\lambda_y) \cdot \cos(2\pi y/\lambda_y) \quad (3)$$

FIG. 7 is a perspective view of the scale part and the two-dimensional angle sensor which are provided in the stage device in the first embodiment of the invention.

Figure 8:
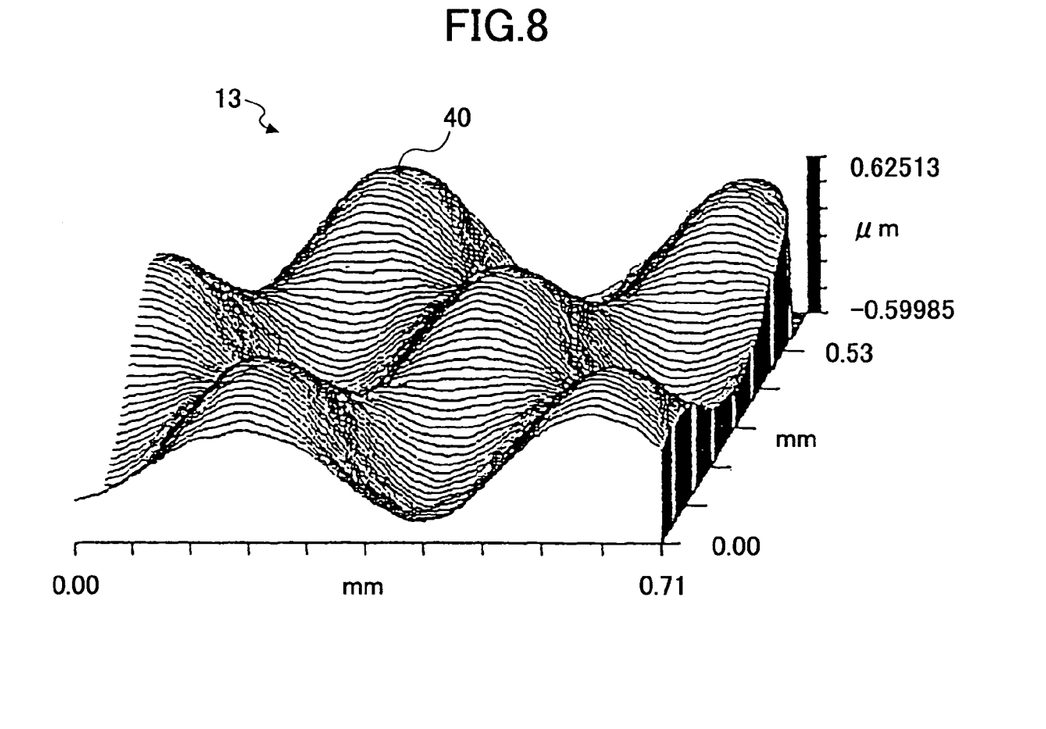
FIG. 8 is a diagram showing the composition of the scale part.

As shown in FIG. 7 and FIG. 8, the scale part 13 is provided on or within the surface of the base 41. And the scale part 13 comprises the angle gratings 40 in which the angle-related characteristic changes in the two dimensions of the X-direction and the Y-direction in accordance with the known function (which is in this embodiment the set of crests and troughs of a sinusoidal wave).

As shown in FIG. 7, a laser beam reflected from the angle gratings 40 is measured using the two-dimensional angle sensor 14 which is adapted for detecting angle changes in the two directions of X and Y. The angle output in each of the respective directions changes with a change in the position of the sloping face of the crests even if the height from the crests of the angle gratings is the same. Therefore, a two-dimensional coordinate position can be determined based on a change of the angle output.

Accordingly, the scale part 13 is attached to the base 231 and the two-dimensional angle sensor 14 is attached to the movable stage part 237, and the two-dimensional coordinates of the movable stage part 237 (or the movable body) can be detected with the relative movement of the scale part and the two-dimensional angle sensor.

The angle gratings 40 in this embodiment are produced by processing a cylindrical-shape material made of aluminum. The height configuration of the angle gratings 40 can be expressed by the superposition of a sinusoidal wave with the amplitude of 0.3 micrometers and the period of 300 micrometers. The angle amplitude of the angle gratings 40 in this embodiment is ±21.6 minutes.

Figure 9:
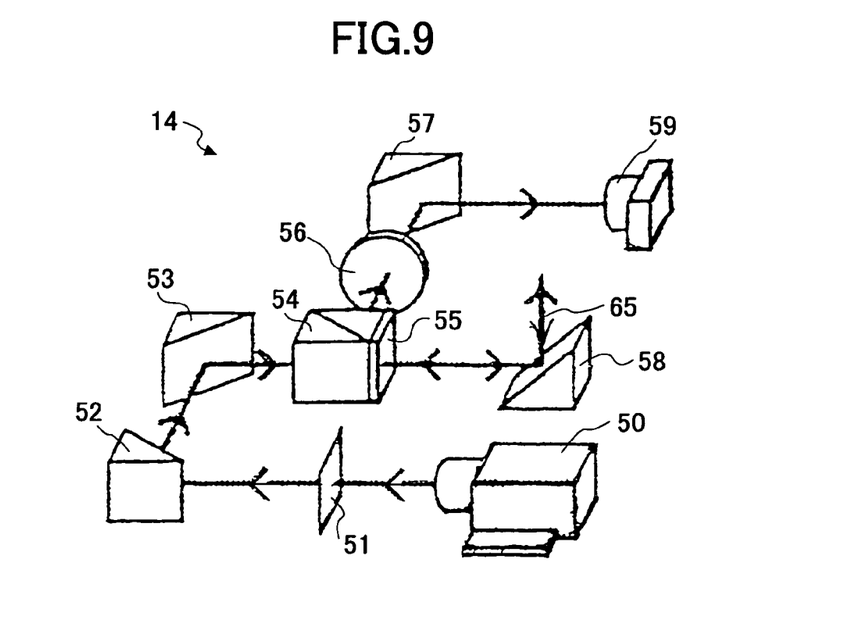
FIG. 9 is a diagram showing the composition of an optical system of the two-dimensional angle sensor provided in the stage device of the first embodiment.

FIG. 9 is a diagram showing the composition of the optical system of the two-dimensional angle sensor which is provided in the stage device of the first embodiment.

The optical system of the two-dimensional angle sensor 14 comprises a light source 50, reflection prisms 52, 53, 57, and 58, a beam splitter 54, a ¼ wavelength plate 55, a collimator lens 56, and a photodiode 59. And the laser beam 65 which is emitted by the light source 50 passes through the grid film 51, and is reflected by the reflection prisms 52 and 53. The p-polarized light component of the laser beam 65, the direction of which is changed, passes through the beam splitter 54 and the ¼ wavelength plate 55, and it is reflected upward by the reflection prism 58 and hits the scale part 13 (the angle gratings 40) which is attached to the base 231.

The laser beam 65 reflected by the scale part 13 (the angle gratings 40) passes through the ¼ wavelength plate 55 again, so that it is converted into an s-polarized light beam. And this light beam is reflected by the beam splitter 54, so that it passes through the collimator lens 56. The light beam from the collimator lens 56 is focused on the photodiode 59 which is located at the focal distance from the collimator lens 56. The photodiode 59 is divided into four division parts. In this manner, the two-dimensional angle sensor 14 detects a two-dimensional angle change according to the principle of the laser auto-collimation.

In the surface encoder 249 having the above-mentioned structure, the configuration of the angle gratings 40 serves as the criteria of position detection. And, if an error is contained in the configuration, position detection accuracy will be affected by the error. If the number of the laser beams which are the probes of the two-dimensional angle sensors 14 is one, the output of the laser beam will be greatly affected by a change of the pitch of the lattices of the angle gratings 40 and an error of the configuration of the angle gratings 40. The influences of such errors can be eliminated by emitting a plurality of laser beams to the equal-phase portions of the angle gratings 40 so that a plurality of crests in the angle gratings 40 can be always observed.

Therefore, in this embodiment, the three two-dimensional angle sensors 14A-14C are provided on the movable stage part 237, and this allows a plurality of laser beams to be emitted to the equal-phase portions of the angle gratings 40. By this composition, the high frequency components of variations in the configuration of the angle gratings 40 (lattice pitch) and the influences of the errors of the configuration of the angle gratings 40 are averaged. Thus, it is possible to attain improvement in measurement accuracy.

Moreover, in this embodiment, the three two-dimensional angle sensors 14A-14C are combined with the angle gratings 40, and it is possible to detect a two-dimensional coordinates position, a pitching angle, a rolling angle, and a yawing angle of the moving body with the relative movement between the scale part 13 and the two-dimensional angle sensors 14A-14C. Further, it is possible to detect a distance between the scale part 13 and the two-dimensional angle sensors 14A-14C, by giving a predetermined angle change to the two-dimensional angle sensors 14A-14C.

Moreover, the two-dimensional angle sensors 14A-14C have a dead pass which is very small when compared with the conventional laser interferometer, and the two-dimensional angle sensors 14A-14C cannot be easily influenced by an instrumentation error due to thermal expansion, fluctuation of air, etc. Thus, it is possible to perform a high-accuracy position and attitude measurement.

As described previously, in this embodiment, an angle change of the laser beam reflected from the angle gratings 40 is measured using the two-dimensional angle sensors 14A-14C which are adapted for detecting angle changes in the two directions of X and Y. The angle output in each of the respective directions changes with a change in the position of the sloping face of the crests even if the height from the crests of the angle gratings is the same. A two-dimensional coordinate position can be determined based on a change of the angle output.

Accordingly, the scale part 13 is attached to the base 231 and the two-dimensional angle sensors 14A-14C are attached to the movable stage part 237, which makes it possible to detect a two-dimensional coordinate position of the movable stage part 237 (or the fixed stage 239).

As described in the foregoing, the surface encoder 249 is provided in the stage device 230 provided with the SAW- YER motor drive part, and it is possible to attain the miniaturization of the stage device. With the movable stage part 237 which can be actuated to the base 231 in any of the X direction, the Y direction and the θ direction, the measurement of a position of the fixed stage part 239 (or the movable stage part 237) to the base 231 can be performed with high accuracy.

In the case of the conventional stage device 200, position detection of the stage is performed with the laser beam from the laser measuring instrument 223, and if a plurality of stages are provided on the single base 211, the laser beam may be intercepted by the stages. However, in the case of the stage device 230 of the present embodiment, position detection of the stage 236 can be performed with the stage 236 by itself, and even if a plurality of stages 236 are provided on the single base 231, position detection of each of the plurality of stages 236 can be performed with sufficient accuracy.

In the above-mentioned embodiment, the case in which the three two-dimensional angle sensors are provided has been described. However, the composition in which one two-dimensional angle sensor is provided may be used, and the same effectiveness as the above-mentioned embodiment can be acquired.

Next, a description will be given of the stage device 10 in the second embodiment of the invention with reference to FIG. 10 and FIG. 11.

Figure 10:
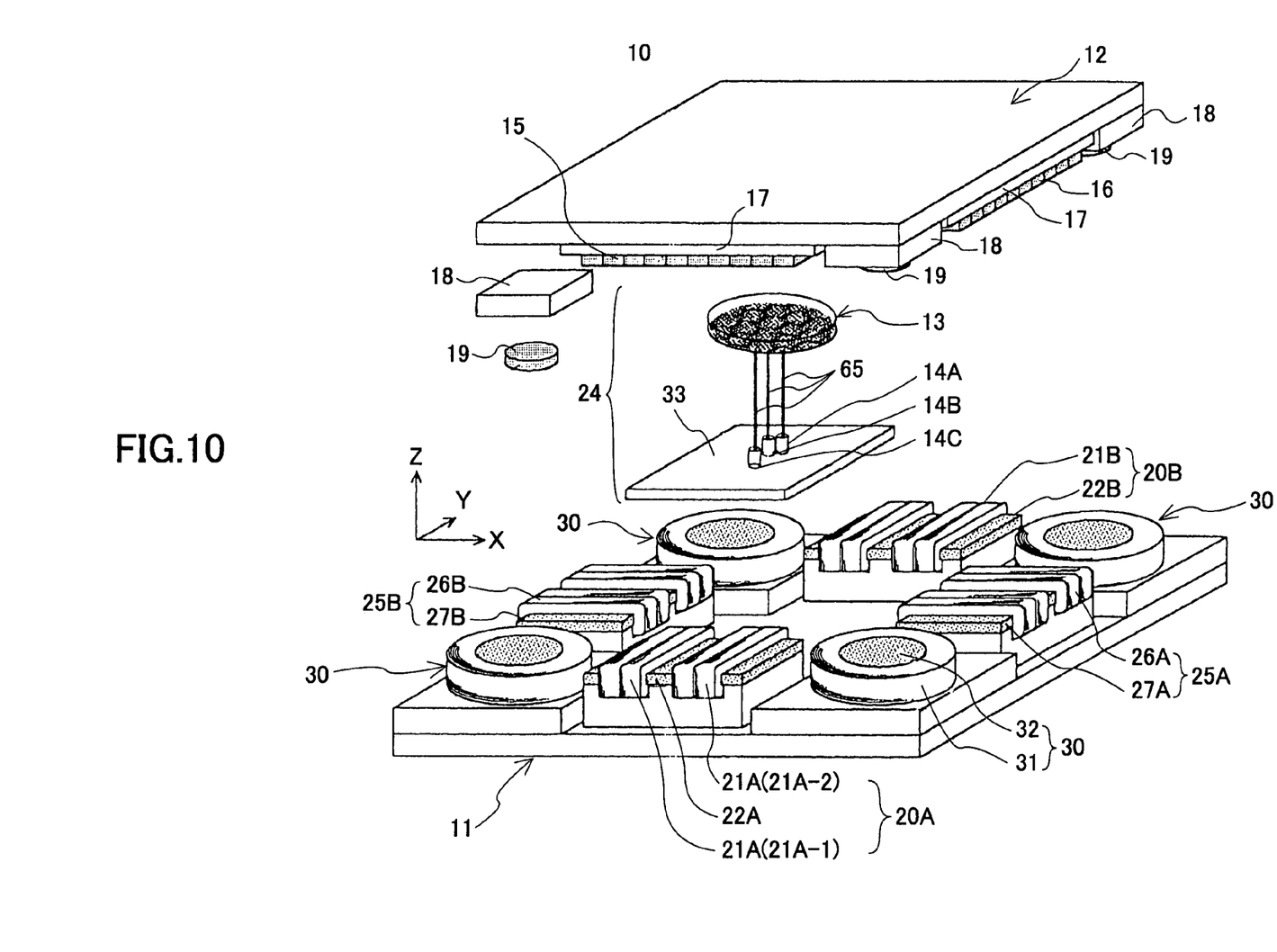
FIG. 10 is an exploded perspective view of a stage device in a second embodiment of the invention.
Figure 11:
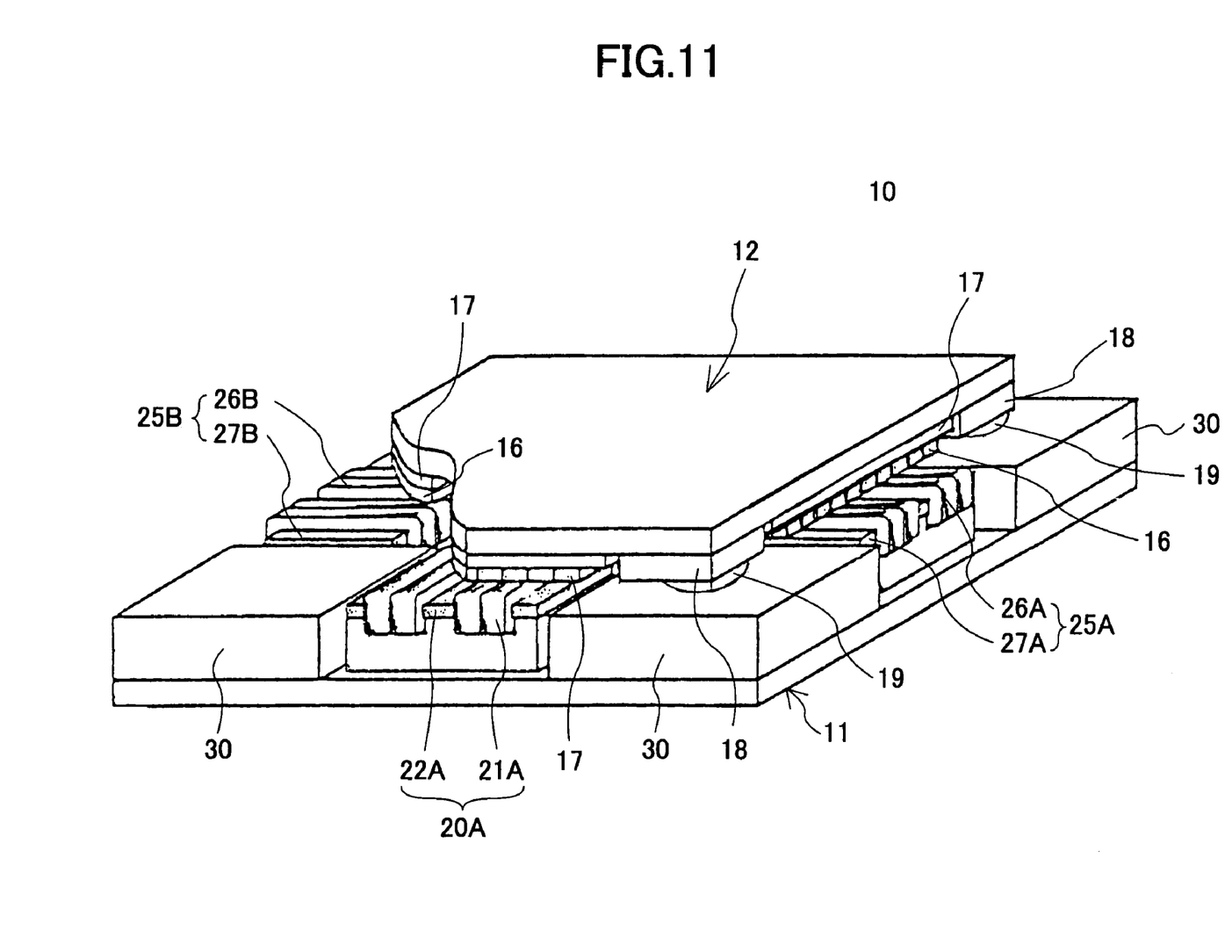
FIG. 11 is a partially cut-away perspective view of the stage device which is in the assembled condition.

FIG. 10 is an exploded perspective view of the stage device 10 in the second embodiment of the invention, and FIG. 11 is a partially cut-away perspective view of the stage device 10 which is in the assembled condition.

The stage device 10 is provided for moving the wafer, which is a movable body in the stepper in the semiconductor manufacturing process, to a predetermined position.

The stage device 10 comprises the base 11, the stage 12, the surface encoder 24, the drive unit, etc. The base 11 serves as the base of the stage device 10, and the linear motor structure parts 20A and 25A, the Z-direction electromagnet 30, and the two-dimensional angle sensors 14A-14C, etc. which will be described later are disposed on the base 11.

In the present embodiment, the case in which the two-dimensional angle sensors 14A-14C used in the first embodiment are used will be explained.

Figure 13:
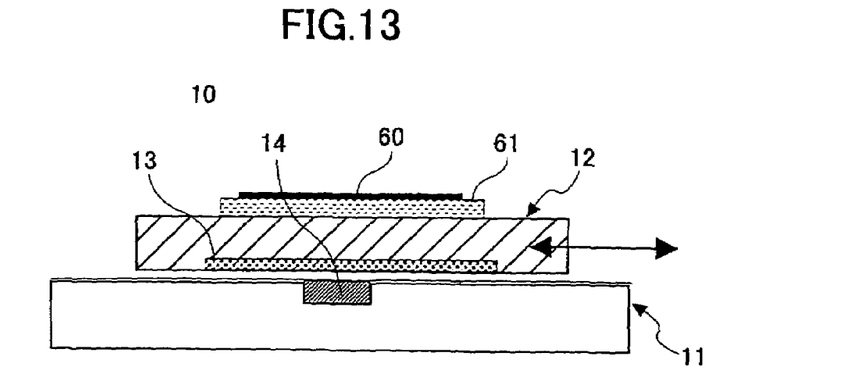
FIG. 13 is a diagram showing the composition of the stage device of the present embodiment.

The wafer 60 and the chuck 61 which are used as a movable body are disposed on the upper part of the stage 12 (refer to FIG. 13). The Z-direction magnet 19 is disposed on the lower part of the stage 12 through the magnets 15 and 16, the yoke 17, and the spacer 18.

The stage 12 is provided so that the X-direction movement, the Y-direction movement, and the rotational movement around the Z axis of the stage 12 to the base 11 are possible as indicated by the arrows in FIG. 10. The surface encoder 24 in this embodiment is essentially the same as that in the first embodiment.

In the present embodiment, the three two-dimensional angle sensors 14A-14C are provided. However, in order to facilitate understanding of the present invention, in the following, a description will be given of the composition in which only one two-dimensional angle sensor 14 is provided.

As shown in FIG. 10, the scale part 13 in this embodiment is fixed to the mid gear of the back surface (or the surface which confronts the base 11) of the stage 12.

On the other hand, the two-dimensional angle sensors 14 are in the structure disposed in the base 11.

Next, the drive unit will be explained with reference to FIG. 10 and FIG. 11.

The drive unit has the X-direction movement, the Y-direction movement, and the rotational movement around the Z-axis of the stage 12 to the base 11.

The X-direction linear motor structure parts 20A and 20B by which this drive unit is disposed on the base 11, the Y-direction linear motor structure parts 25A and 25B, and the Z-direction electromagnet 30, it is constituted by the X-direction magnet 15 disposed on the stage 12, the Y-direction magnet 16, and the Z-direction magnet 19.

The X-direction linear motor structure part 20A is disposed on the base 11, and it is constituted by the pair of X-direction coils 21A-1 and 21A-2 (both sides are packed and unacquainted it is called coil 21A for the directions of X), and core 22A for the directions of X.

The pair of the X-direction coils 21A-1 and 21A-2 are arranged side by side in the X-direction as indicated by the arrow, and it is in the structure which can supply the current independently, respectively.

The X-direction linear motor structure part 20B is in the same structure as the X-direction linear motor structure part 20A, and is constituted by coil 21B (although a code does not give, constituted by the coil for the directions of X of the pair) for the directions of X, and core 22B for the directions of X.

The X-direction linear motor structure part 20A and the X-direction linear motor structure part 20B face across the arranging position of the above mentioned two-dimensional angle sensors 14A-14C, and are in the structure estranged and arranged in the Y direction as indicated by the arrow.

On the other hand, the Y-direction linear motor structure part 25A and the Y-direction linear motor structure part 25B are also in the same structure as the above mentioned X-direction linear motor structure part 20A. That is, the Y-direction linear motor structure part 25A is constituted by the Y-direction coils 26A and the Y-direction core 27A, and the Y-direction linear motor structure part 25B is constituted by the Y-direction coils 26B and the Y-direction core 27B.

The Y-direction linear motor structure part 25A and the Y-direction linear motor structure part 25B face across the position where the above-mentioned two-dimensional angle sensors 14A-14C are disposed, and they are in the structure arranged in the X direction as indicated by the arrow.

The Z-direction electromagnet 30 has the function to form a gap between the X-direction linear motor structure part 20A, 20B or the Y-direction linear motor structure part 25A, 25B provided on the base 11 and the magnet 15 or 16 provided on the stage 12, when the stage 12 is lifted from the base 11.

The Z-direction electromagnet 30 is constituted by the Z-direction coil 31 and the Z-direction core 32. In order to stabilize the lifting action, it is disposed in the four-corner positions of the base 11 in a rectangular shape, respectively. The mechanism for lifting the stage 12 from the base 11, other than the magnetic unit used in this embodiment, may include a unit utilizing a compressed air, a unit supporting the base 11 with two or more balls, etc.

On the other hand, as described above, the X-direction magnet 15 and the Y-direction magnet 16 are disposed on the stage 12. Although it is not illustrated, four pairs of the magnets 15 and 16 in total are disposed, respectively. Therefore, the magnets 15 and 16 are arranged so as to form a generally square configuration on the bottom of the stage 12.

The X-direction magnet 15 is constituted by two or more magnet rows (the set of small magnets) which arranged two or more equivalent permanent magnets in the shape of a straight line so that a polarity might appear by turns.

Similarly, the Y-direction magnet 16 is also constituted by two or more magnet rows which arranged two or more equivalent permanent magnets in the shape of a straight line so that a polarity might appear by turns.

The yoke 17 is disposed in the upper part of each magnets 15 and 16, and this yoke 17 does so the function which combines magnetically two or more magnets of each which constitute each magnets 15 and 16.

In the above-mentioned structure, in the condition of having equipped with the stage 12 to the base 11, it is constituted so that one of the pair of the X-direction magnets 15 may be located on the X-direction linear motor structure part 20A, and the other of the pair of the X-direction magnets 15 may be located on the X-direction linear motor structure part 20B.

In the condition of having equipped with the stage 12 to the base 11, it is constituted so that one of the pair of the Y-direction magnets 16 may be located on the Y-direction linear motor structure part 25A, and the other of the pair of the Y-direction magnets 16 may be located on the Y-direction linear motor structure part 25B.

In the condition that the stage 12 is equipped with the base 11, and it sets in the condition that the stage 12 is lifted over the base 11 with the Z-direction electromagnet 30. It is constituted so that it may engage with the linear motor structure parts 20A, 20B, 25A, and 25B which the surface which each magnets 15 and 16 generate confronts.

In the above-mentioned wearing condition, each magnets 15 and 16 are arranged so that it may intersect perpendicularly to the winding direction of each coils 21A, 21B, 26A, and 26B established in each linear motor structure parts 20A, 20B, 25A, and 25B.

By considering the drive unit as the above-mentioned structure, the direction linear motor structure parts 20A and 20B of X and magnet 15 for the directions of X collaborate, and function as a linear motor which drives stage 12 in the X direction as indicated by the arrow.

Similarly, the direction linear motor structure parts 25A and 25B of Y and magnet 16 for the directions of Y collaborate, and function as a linear motor which drives stage 12 in the Y direction as indicated by the arrow.

That is, in this embodiment, it becomes the structure that 2 sets of linear motors have been arranged at X and each Y both directions, respectively.

Since comparatively large space can be retained in the center portion of the device having this structure, the surface encoder 24 can be arranged in the center portion. In this embodiment, the structure which disposed scale part 13 in stage 12, and disposed two-dimensional angle sensors 14A-14C in the base 11. This is because it is not necessary to connect wiring to scale part 13.

However, it is also possible to have structure which disposes scale part 13 in the base 11, and forms two-dimensional angle sensors 14A-14C in stage 12.

In the drive unit in the above-mentioned structure, if only the direction linear motor structure part 20A of X and the direction linear motor structure part 20B of X are made to drive in this direction simultaneously, translation of the stage 12 will be carried out in the X direction as indicated by the arrow.

Similarly, if only the direction linear motor structure part 25A of Y and the direction linear motor structure part 25B of Y are made to drive in this direction simultaneously, translation of the stage 12 will be carried out in the direction indicated by the arrow Y in FIG. 11.

The stage 12 is rotated around the Z-axis θZ indicated by the arrow in FIG. 11, by making a reverse direction drive each linear motor structure part 20A which became a pair, and 20B, 25A and 25B, respectively.

Next, with reference to FIG. 12, the principle of moving the stage 12 using the drive unit will be explained.

In order to simplify description, one linear motor (magnet 15 for the directions of X and the direction linear motor structure part 20A of X) made to move in the direction of X on stage 12 shall be mentioned as an example, and shall be explained.

Figure 12:
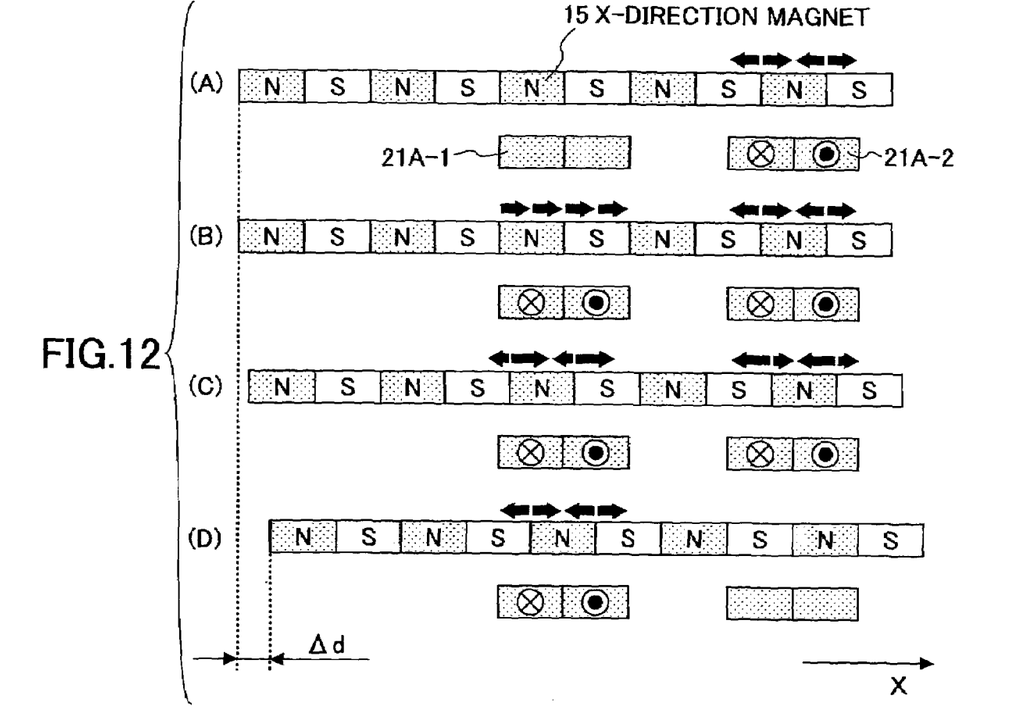
FIG. 12 is a diagram for explaining the principle of moving the stage.

FIG. 12 is a diagram for explaining the principle of moving the stage. When the current is supplied in the X direction by the X-direction coil 21A-2 as shown in FIG. 12(A), the X-direction magnets 15 stop in the place where the force in alignment with the X-axis arose at between the current and magnet 15 for the directions of X which confronted it, and each produced force balanced with it.

When the current is supplied by the X-direction coil 21A-1 in this condition as shown in FIG. 12(B), the rightward force will arise, respectively to the X-direction magnet 15 which confronts the X-direction coil 21A-1.

As the X-direction magnet 15 (or the stage 12) starts to move, as shown in FIG. 12(C), according to this force, the magnet is moved to the position where the force produced to the magnet by the X-direction coil 21A-1 and the X-direction coil 21A-2 being balanced.

Then, if the supply of the current to the X-direction coil 21A-2 is stopped, as shown in FIG. 12(D), it will move in the position where the force balances with the current of the X-direction coil 21A-1.

By the above-mentioned action shown in FIG. 12(A)-(D), the X-direction magnet 15 (or the stage 12) is moved by Δd which is equivalent to half the distance of the magnet.

If the current supplied to the X-direction coils 21A-1 and 21A-2 as mentioned above is driven only in ON and OFF, only movement of every ¼ magnet can be performed. If the ratio of the magnitude of the current supplied by the X-direction coils 21A-1 and 21A-2 in the condition shown in FIG. 12(C) is changed, the X-direction magnet 15 is moved to the position which balanced with the magnitude of each current according to it, the magnet can be moved to an arbitrary position by half-within the limits.

It can drive freely within limits in which the arrangement of the X-direction magnet 15 exists by changing the direction of the current supplied to the coil according to the polarity of the X-direction magnet 15 which confronts.

Unlike the normal direct-current motor, in this embodiment, it drives in the shape of a stepping motor near the position where the force always produced on the stage 12 balances. For this reason, open-loop actuation of the stage 12 can be performed by calculating the voltage supplied to each coil 21A-1 and 21A-2.

Although one linear motor (the X-direction magnet 15 and the X-direction linear motor structure part 20A) which is moved in the X direction on the stage 12 has been mentioned as the example and description of the above-mentioned drive unit explained it.

The actuation principle of the linear motor which comprises other magnets 15 and 16, and the X-direction linear motor structure part 20B and the Y-direction linear motor structure parts 25A and 25B are also the same. It is possible to control movement of the direction of X and the direction of Y and the revolution around the Z-axis of the stage 12 by the drive unit in the above-mentioned structure with an one-step configuration.

It receives for all directions and it is not necessary to have guide structure, and since stage 12 which is a final stage is the structure driven directly, the weight saving of stage device 10, rigid improvement, and abatement of a manufacturing cost can be aimed at. It enables the servo engine performance to secure to a high frequency region also in a control side by the stage device 10 carrying out a weight saving, and being able to aim at rigid improvement.

Figure 14:
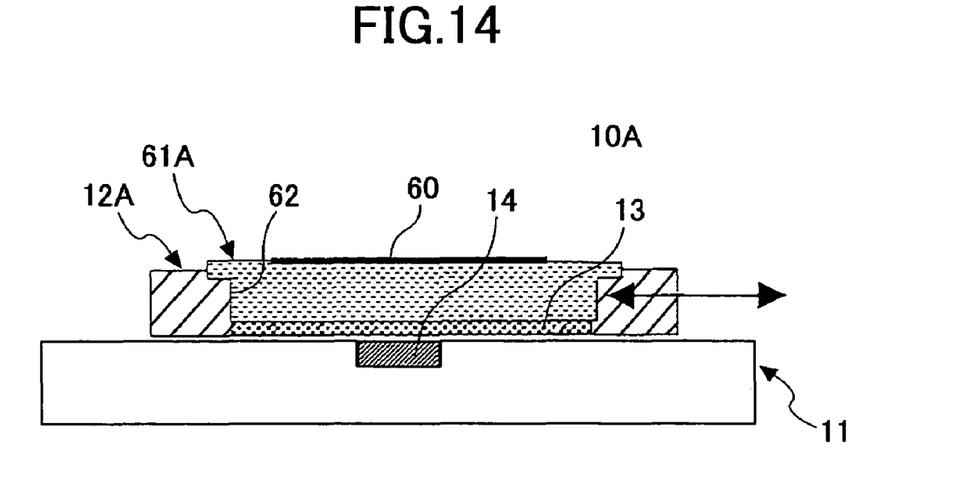
FIG. 14 is a diagram showing the composition of a modification of the stage device of the present embodiment.

Next, a modification of the above-mentioned stage device 10 will be explained. FIG. 14 is a diagram showing the composition of a modification of the stage device 10A in the present embodiment.

Figure 15:
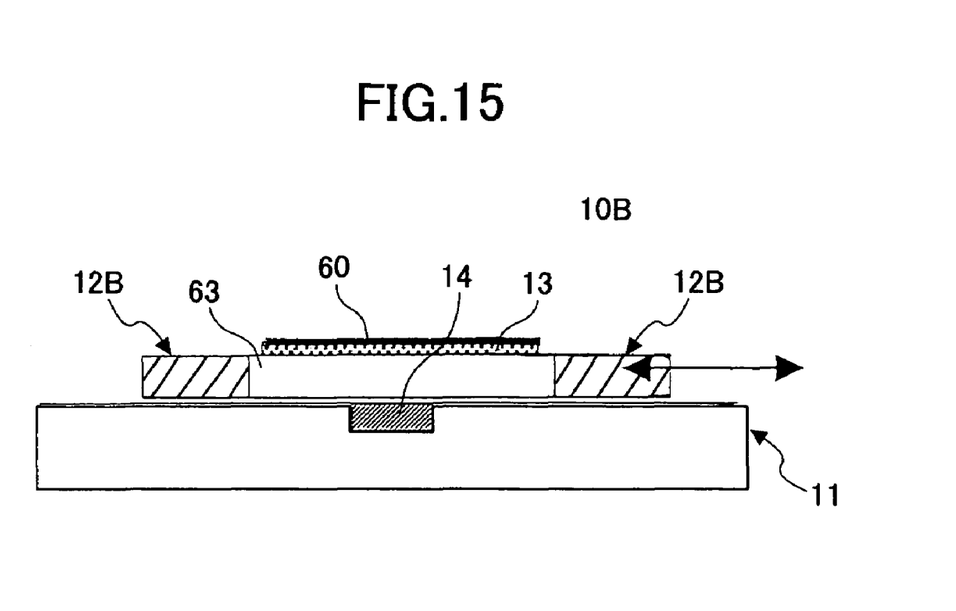
FIG. 15 is a diagram showing the composition of another modification of the stage device of the present embodiment.

In FIG. 14 and FIG. 15, the same code shall be attached about the same structure as the structure of stage device 10, and the description shall be omitted. The stage device 10A of this modification considers the chuck 61A holding the wafer 60 as the structure which can be detached and attached to the stage 12A, and it is in the structure in which the scale part 13 is disposed on the chuck 61A.

The mounting part 62 is provided in the stage 12A, and, specifically, the chuck 61A is in the structure in which insertion or removal is possible in the mounting part 62.

Thereby, the chuck 61A is in the structure which can be detached and attached to the stage 12A. In the condition that the stage 12A is equipped, the base of the chuck 61A is constituted so that it may expose from the base of the stage 12A.

The scale part 13 is disposed in the base of the chuck 61A. Therefore, in the condition of having equipped the stage 12A with the chuck 61A, it exposes from the base of the stage 12A, and the scale part 13 will be in the condition of having confronted with the two-dimensional angle sensors 14 provided in the base 11.

Thereby, the two-dimensional angle sensors 14 outputs the laser beam 65 to the scale part 13 and they become possible entering the emitted light beam, they become possible performing position measurement of the stage 12A. Since the scale part 13 is provided in the wafer 60 and the chuck 61A dealt with in one in this modification, even if an error arises between the chuck 61A and the stage 12A, it is lost that this affects the test result of the surface encoder 24, and, therefore, highly precise position instrumentation can be performed.

FIG. 15 is a diagram showing the composition of another modification of the stage device 10B of the present embodiment. In this modification, it is characterized by allocating the scale part 13 in the tooth-back side of the wafer 60 used as a movable body directly.

The transparent part 63 is provided in the scale part 13 of the stage 12B, and the area which confronts so that the laser beam 65 irradiated from two-dimensional angle sensors 14 may be irradiated by the scale part 13, so that scale part 13 disposed in the tooth-back side of wafer 60 can be checked with the two-dimensional angle sensors 14.

The scale part 13 may be the structure provided in one by fixing by sticking on the wafer 60 etc., and the processing wafer 60 directly. Thereby, the scale part 13 serves as structure united with the wafer 60.

The transparent part 63 is made of, for example, a glass or transparent resin inserted in the stage 12B. In this modification, the scale part 13 is disposed on the wafer 60 the very thing used as a movable body, occurrence of an error between the chuck 61A and the scale part 13 with a possibility of generating with the structure concerning the above-mentioned modification can be prevented, and highly precise position instrumentation can be performed.

The two-dimensional angle sensors 14 of the stage 12B, and the area (set up carry out movement range rear-spring-supporter opposite) which confronts even if the scale part 13 is disposed by the wafer 60, and the transparent part 63 for irradiating the scale part 13 65 is provided, position instrumentation of the stage 12 (or the wafer 60) can be ensured.

The above-mentioned stage device of the invention can be widely applied to not only semiconductor manufacturing devices but also the field of art which needs micro fabrication, such as micromachines, optical communication parts for information technology, etc. That is, many of the current micromachine manufacturing techniques use semiconductor manufacturing technology, and the use of the stage device of the invention will make it possible to manufacture various smaller micromachines. Moreover, in the field of laser beam machining, it is demanded that the stage is moved by a submicron accuracy at a very high speed.

Furthermore, in order to process a complicated configuration, a stage device having a large number of degrees of freedom is demanded. Although none of the conventional stage devices meets such demands, it is possible for the stage device of the invention to meet the demands of a high level of accuracy, a high speed and a large number of degrees of freedom. The stage device of the invention can be used also as a stage device for laser beam machining.

Moreover, the stage device of the invention is applicable to not only the above-mentioned fields but also the assembly processes of electronic parts, such as super-precision mechanical devices, super-precision measuring devices or mounters, inspection devices, and other devices in the office automation field.

The present invention is not limited to the above-described embodiment, and variations and modifications may be made without departing from the scope of the present invention. In the above-described embodiments, the stage device in which the three two-dimensional angle sensors are provided has been explained. However, the present invention is not limited to the specific number of two-dimensional angle sensors in the above-described embodiments. For example, the composition in which only one two-dimensional angle sensor is provided may be sufficient to solve the above-mentioned problems of the related art.

The present invention is applicable to a stage device which can attain the miniaturization of the stage device and can perform measurement of a position of the stage to the base with high accuracy.

The disclosure of Japanese Patent Application No. 2004-80603, filed on Mar. 19, 2004, including the specification, drawings and claims, is incorporated herein by reference in its entirety.

What is claimed is:

1. A stage device comprising:
   a base;
   a stage carrying a movable body and being moved over the base;
   a planar motor driving the stage;
   an air bearing acting to lift the stage over the base;
   a scale part disposed on the base to include an angle grating which has an angle-related characteristic varied in a two-dimensional direction in accordance with a known function; and
   at least one two-dimensional angle sensor disposed on the stage so that the at least one two-dimensional angle sensor emits a light beam to the angle grating of the scale part and detects a two-dimensional angle of a light beam reflected from the scale part.

2. The stage device according to claim 1 wherein the scale part is covered with a protection member of a transparent material.

3. The stage device according to claim 1 wherein the stage device comprises two or more two-dimensional angle sensors including the at least one two-dimensional angle sensor.

4. The stage device according to claim 3 wherein the at least one two dimensional angle sensor is disposed so that the at least one two-dimensional angle sensor is adapted to measure at least one of a two-dimensional coordinate position, a pitching angle, a rolling angle and a yawing angle of the stage.

5. The stage device according to claim 4 wherein the two-dimensional coordinate position is represented by any of rectangular coordinates, cylindrical coordinates, polar coordinates, and free-form surface coordinates.

6. The stage device according to claim 4 wherein the at least one two-dimensional angle sensor is adapted to measure a distance between the scale part and the at least one two-dimensional angle sensor by giving a predetermined angle change to the at least one two-dimensional angle sensor.

* * * * *

UNITED STATES PATENT AND TRADEMARK OFFICE
CERTIFICATE OF CORRECTION

PATENT NO. : 7,257,902 B2
APPLICATION NO. : 11/522400
DATED : August 21, 2007
INVENTOR(S) : Wei Gao et al.

It is certified that error appears in the above-identified patent and that said Letters Patent is hereby corrected as shown below:

On the Title Page of the Patent:

In Section (73):

Please add the second assignee's name and should read as follows:

--Tohoku Technoarch Co., Ltd.--

Signed and Sealed this

Seventh Day of April, 2009

JOHN DOLL
*Acting Director of the United States Patent and Trademark Office*